(12) United States Patent
Liu et al.

(10) Patent No.: US 8,525,192 B2
(45) Date of Patent: Sep. 3, 2013

(54) DIE PACKAGE INCLUDING SUBSTRATE WITH MOLDED DEVICE

(75) Inventors: Yong Liu, Scarborough, ME (US); Zhongfa Yuan, Jiangsu (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 13/246,682

(22) Filed: Sep. 27, 2011

(65) Prior Publication Data

US 2012/0012993 A1    Jan. 19, 2012

Related U.S. Application Data

(63) Continuation of application No. 11/971,556, filed on Jan. 9, 2008, now Pat. No. 8,106,406.

(51) Int. Cl.
*H01L 27/15* (2006.01)
*H01L 31/12* (2006.01)
*H01L 33/00* (2010.01)

(52) U.S. Cl.
USPC ............................. 257/82; 257/676; 438/24

(58) Field of Classification Search
USPC ........................................... 257/82; 438/24
See application file for complete search history.

(56) References Cited

U.S. PATENT DOCUMENTS

| | | |
|---|---|---|
| 3,956,821 A | 5/1976 | Martin |
| 4,058,899 A | 11/1977 | Phy |
| 4,680,613 A | 7/1987 | Daniels et al. |
| 4,720,396 A | 1/1988 | Wood |
| 4,731,701 A | 3/1988 | Kuo et al. |
| 4,751,199 A | 6/1988 | Phy |
| 4,772,935 A | 9/1988 | Lawler et al. |
| 4,791,473 A | 12/1988 | Phy |
| 4,796,080 A | 1/1989 | Phy |
| 4,839,717 A | 6/1989 | Phy et al. |
| 4,890,153 A | 12/1989 | Wu |
| 5,148,243 A | 9/1992 | Merrick et al. |
| 5,327,325 A | 7/1994 | Nicewarner, Jr. et al. |
| 5,545,893 A | 8/1996 | Brown et al. |
| 5,646,446 A | 7/1997 | Nicewarner, Jr. et al. |
| 5,705,833 A | 1/1998 | Noguchi et al. |
| 5,776,797 A | 7/1998 | Nicewarner, Jr. et al. |
| 6,133,067 A * | 10/2000 | Jeng et al. ..................... 438/110 |
| 6,133,634 A | 10/2000 | Joshi |
| 6,329,706 B1 | 12/2001 | Nam |
| 6,344,687 B1 * | 2/2002 | Huang et al. .................. 257/724 |
| 6,424,035 B1 | 7/2002 | Sapp et al. |

(Continued)

FOREIGN PATENT DOCUMENTS

CN    1679162 A    5/2005

OTHER PUBLICATIONS

"Agilent HCPL-7723 & HCPL-0723 50 MBd 2ns PWD High Speed CMOS Optocoupler Data Sheet," Mar. 2005 (12 pages).

(Continued)

*Primary Examiner* — Thien F Tran
(74) *Attorney, Agent, or Firm* — Christensen, O'Connor, Johnson, Kindness PLLC

(57) ABSTRACT

A package is disclosed. The package includes a premolded substrate having a leadframe structure, a first device attached to the leadframe structure, and a molding material covering at least part of the leadframe structure and the first device. It also includes a second device attached to the premolded substrate.

19 Claims, 10 Drawing Sheets

(56) References Cited

U.S. PATENT DOCUMENTS

| | | |
|---|---|---|
| 6,432,750 B2 | 8/2002 | Jeon et al. |
| 6,489,678 B1 | 12/2002 | Joshi |
| 6,556,750 B2 | 4/2003 | Constantino et al. |
| 6,566,749 B1 | 5/2003 | Joshi et al. |
| 6,574,107 B2 | 6/2003 | Jeon et al. |
| 6,621,152 B2 | 9/2003 | Choi et al. |
| 6,627,991 B1 | 9/2003 | Joshi |
| 6,633,030 B2 | 10/2003 | Joshi |
| 6,645,791 B2 | 11/2003 | Noquil et al. |
| 6,674,157 B2 | 1/2004 | Lang |
| 6,683,375 B2 | 1/2004 | Joshi et al. |
| 6,696,321 B2 | 2/2004 | Joshi |
| 6,720,642 B1 | 4/2004 | Joshi et al. |
| 6,731,003 B2 | 5/2004 | Joshi et al. |
| 6,740,541 B2 | 5/2004 | Rajeev |
| 6,756,689 B2 | 6/2004 | Nam et al. |
| 6,774,465 B2 | 8/2004 | Lee et al. |
| 6,777,800 B2 | 8/2004 | Madrid et al. |
| 6,830,959 B2 | 12/2004 | Estacio |
| 6,836,023 B2 | 12/2004 | Joshi et al. |
| 6,867,481 B2 | 3/2005 | Joshi et al. |
| 6,867,489 B1 | 3/2005 | Estacio |
| 6,891,256 B2 | 5/2005 | Joshi et al. |
| 6,891,257 B2 | 5/2005 | Chong et al. |
| 6,893,901 B2 | 5/2005 | Madrid |
| 6,943,434 B2 | 9/2005 | Tangpuz et al. |
| 6,989,588 B2 | 1/2006 | Quinones et al. |
| 6,992,384 B2 | 1/2006 | Joshi |
| 7,022,548 B2 | 4/2006 | Joshi et al. |
| 7,023,077 B2 | 4/2006 | Madrid |
| 7,061,077 B2 | 6/2006 | Joshi et al. |
| 7,061,080 B2 | 6/2006 | Jeun et al. |
| 7,081,666 B2 | 7/2006 | Joshi et al. |
| 7,122,884 B2 | 10/2006 | Cabahug et al. |
| 7,154,168 B2 | 12/2006 | Joshi et al. |
| 7,157,799 B2 | 1/2007 | Noquil et al. |
| 7,196,313 B2 | 3/2007 | Quinones et al. |
| 7,199,461 B2 | 4/2007 | Son et al. |
| 7,208,819 B2 | 4/2007 | Jeun et al. |
| 7,215,011 B2 | 5/2007 | Joshi et al. |
| 7,217,594 B2 | 5/2007 | Manatad |
| 7,242,076 B2 | 7/2007 | Dolan |
| 7,256,479 B2 | 8/2007 | Noquil et al. |
| 7,268,414 B2 | 9/2007 | Choi et al. |
| 7,271,497 B2 | 9/2007 | Joshi et al. |
| 7,285,849 B2 | 10/2007 | Cruz et al. |
| 7,315,077 B2 | 1/2008 | Choi et al. |
| 7,332,806 B2 | 2/2008 | Joshi et al. |
| 7,371,616 B2 | 5/2008 | Jereza |
| 7,768,108 B2 | 8/2010 | Liu et al. |
| 7,791,084 B2 | 9/2010 | Liu et al. |
| 7,825,502 B2 | 11/2010 | Irving et al. |
| 7,915,721 B2 | 3/2011 | Liu et al. |
| 8,018,054 B2 | 9/2011 | Liu et al. |
| 2002/0100962 A1 | 8/2002 | Joshi |
| 2003/0011005 A1 | 1/2003 | Joshi |
| 2003/0075786 A1 | 4/2003 | Joshi et al. |
| 2003/0193080 A1 | 10/2003 | Cabahug et al. |
| 2004/0157372 A1 | 8/2004 | Manatad |
| 2004/0164386 A1 | 8/2004 | Joshi |
| 2005/0127483 A1 | 6/2005 | Joshi et al. |
| 2006/0151861 A1 | 7/2006 | Noquil et al. |
| 2006/0231933 A1 | 10/2006 | Cabahug et al. |
| 2007/0241431 A1 | 10/2007 | Manatad |
| 2008/0105957 A1 | 5/2008 | Joshi |
| 2008/0150100 A1 | 6/2008 | Hung et al. |
| 2009/0194857 A1 | 8/2009 | Liu et al. |

OTHER PUBLICATIONS

"FOD0708 Single Channel CMOS Optocoupler, FOD0738 Dual Channel CMOS Optocoupler," Rev. 1.0.7, Apr. 2006, Fairchild Semiconductor Corporation (11 pages).

Office Action issued by the State Intellectual Property Office of the People's Republic of China in Application No. 2008-10183966.8, mailed Jan. 18, 2012, translation attached.

\* cited by examiner

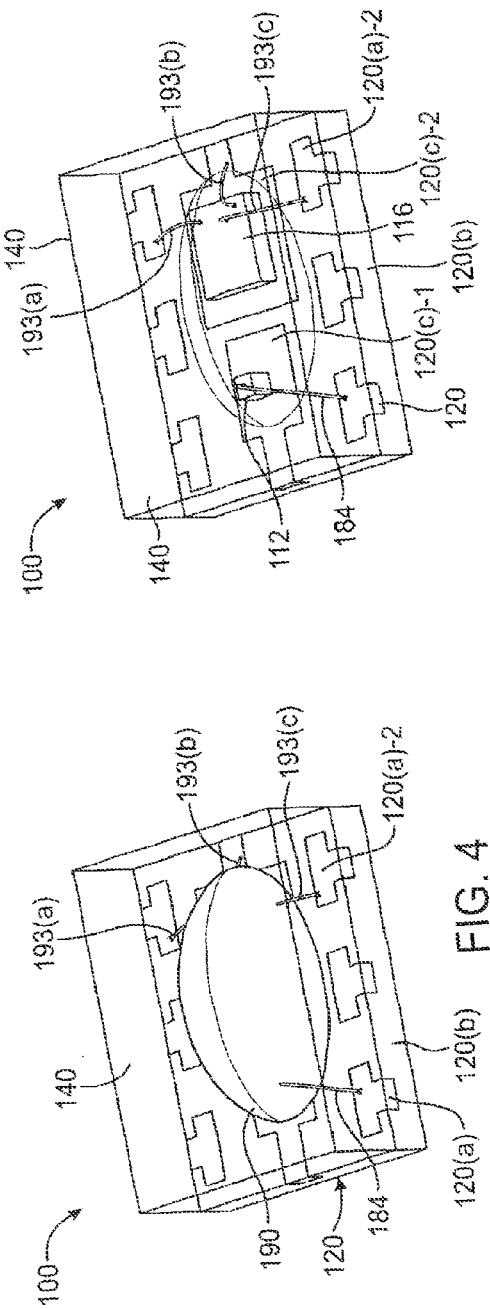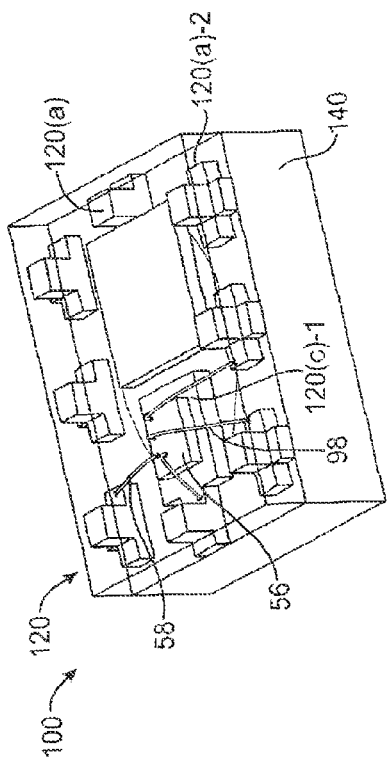

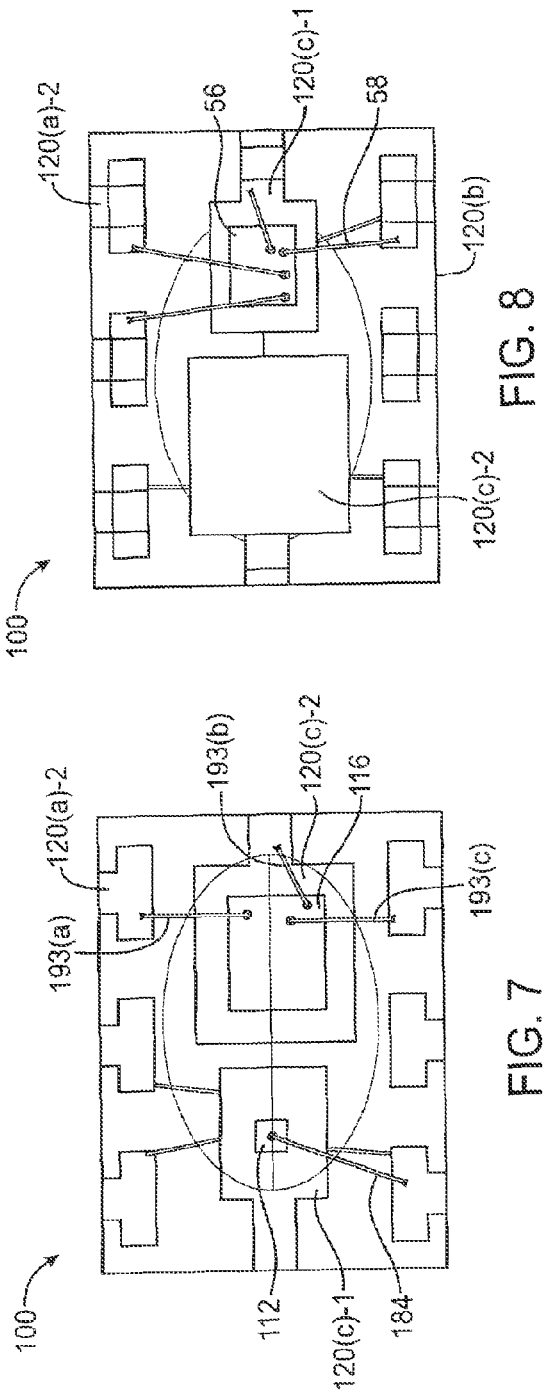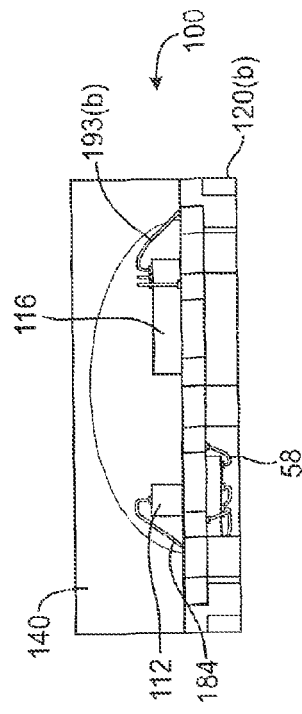

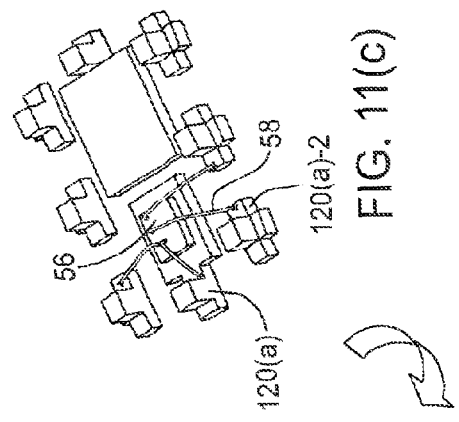
FIG. 11(c)
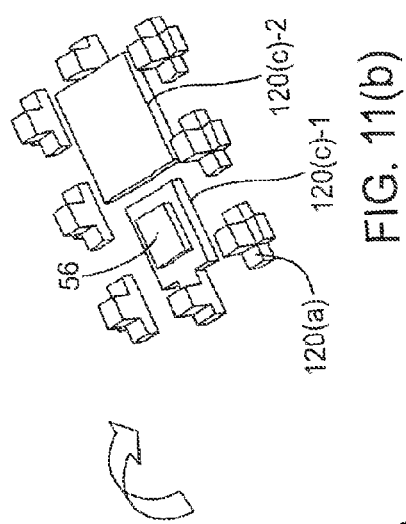
FIG. 11(b)
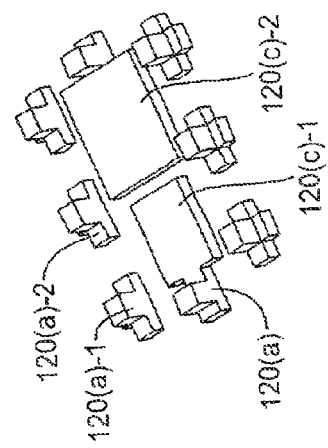
FIG. 11(a)
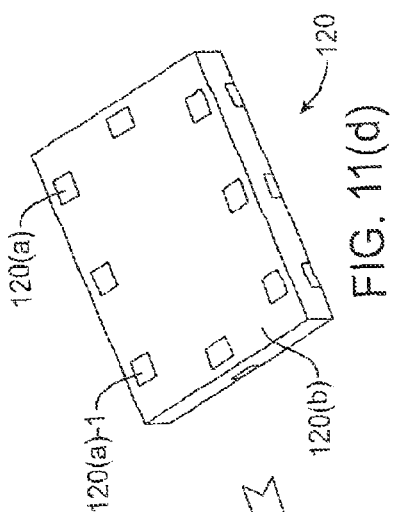
FIG. 11(d)
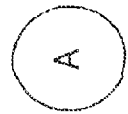
A

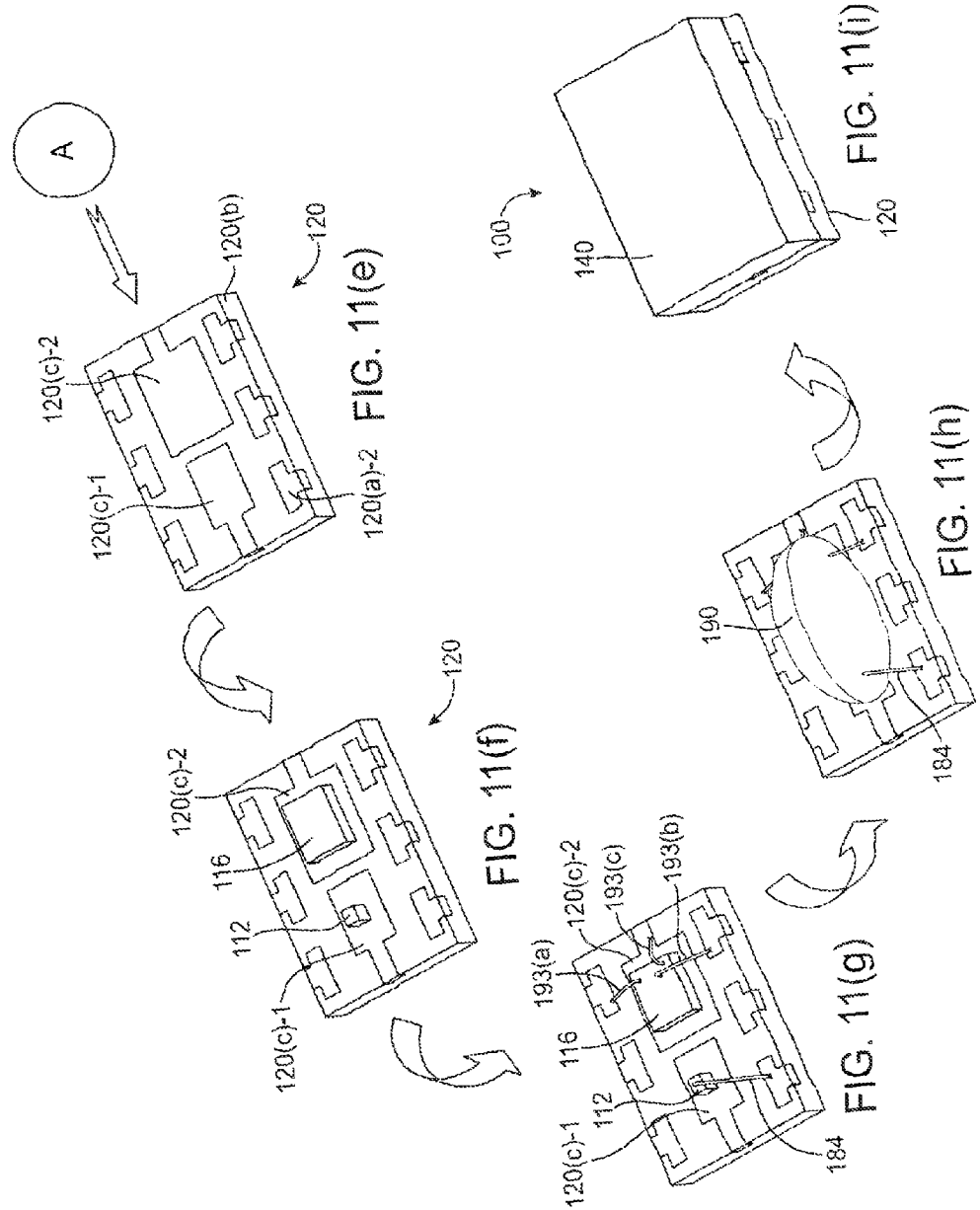

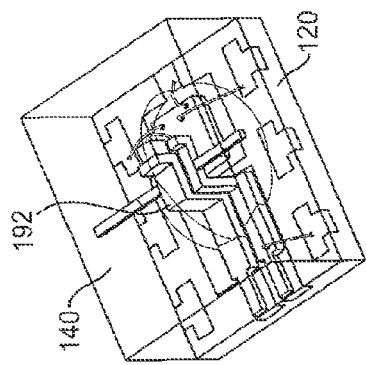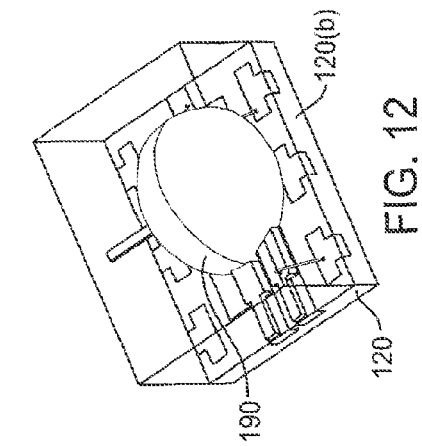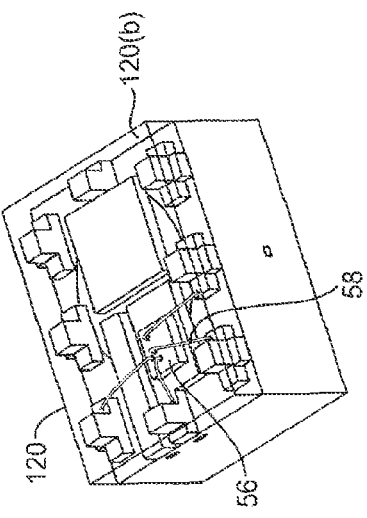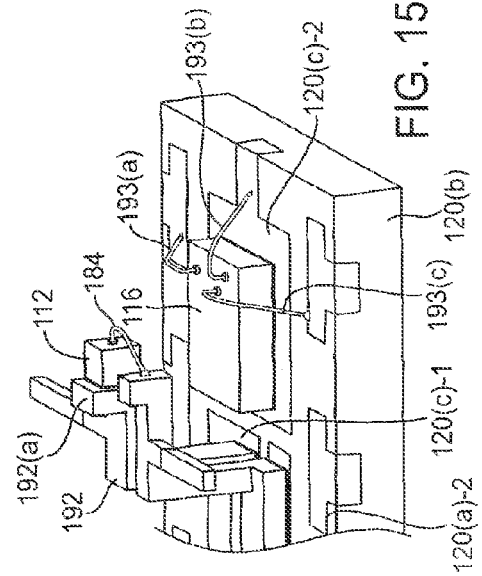

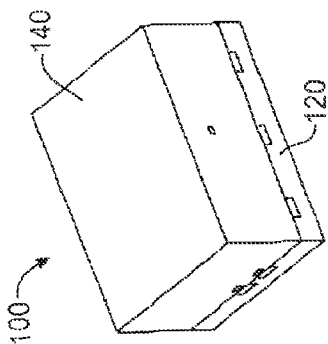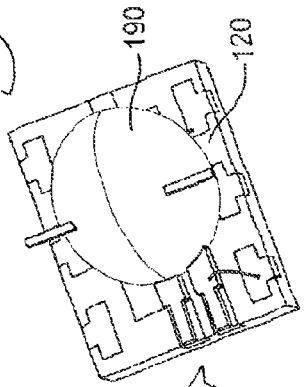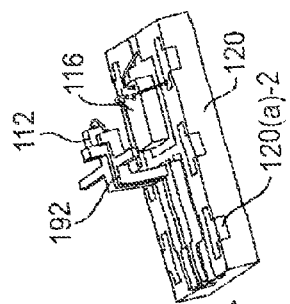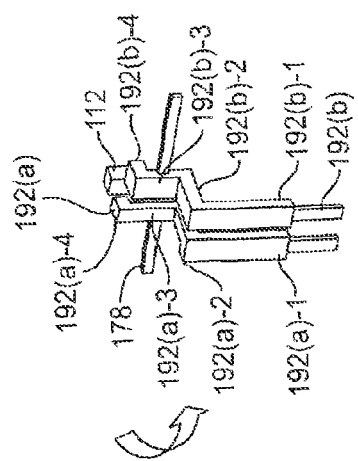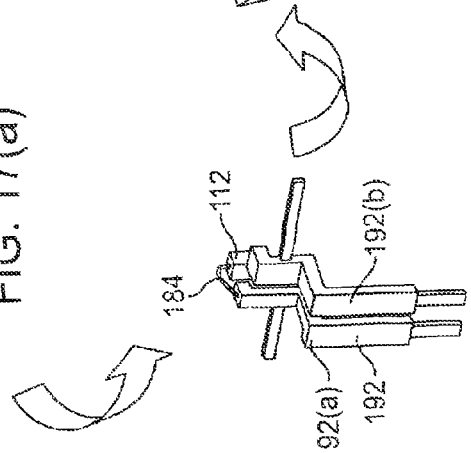

DIE PACKAGE INCLUDING SUBSTRATE WITH MOLDED DEVICE

CROSS-REFERENCE TO RELATED APPLICATIONS

Not applicable.

BACKGROUND

Optocouplers contain at least one optical emitter device which is optically coupled to an optical receiver device through an optically transmissive medium. This arrangement permits the passage of information from one electrical circuit that contains the optical emitter device to another electrical circuit that contains the optical receiver device. A high degree of electrical isolation is maintained between the two circuits. Because information is passed optically across an insulating gap, the transfer is one way. For example, the optical receiver device cannot modify the operation of a circuit containing the optical emitter device. This feature is desirable because, for example, the emitter may be driven by a low voltage circuit using a microprocessor or logic gates, while the output optical receiver device may be part of a high voltage DC or AC load circuit. The optical isolation also prevents damage to the input circuit caused by the relatively hostile output circuit.

FIG. 1 shows a side view of a conventional optocoupler package 10. The illustrated optocoupler 10 includes a substrate 24, and solder balls 18 on the substrate 24. An LED (light emitting diode) device 16 including an optical emitter surface 16(a) and a phototransistor device 12 (including an optical receiver surface 12(a)) are on the substrate 24 and are covered by an optically transmissive medium 22.

The output current generated by phototransistor (diode) device 12 is low (e.g., about several nA, the same level as noise) due to the low efficiency of the phototransistor 12 device to receive very limit light emitting by LED. The optical receiver surface 12(a) of photo transistor 12 does not face the optical emitting surface 16(a) of LED device 16. Consequently, light rays 20 from the LED device 16 hit the optical receiver device 12 and the optical receiver surface 12(a) of photo transistor (or diode) less than 10% of the time.

In addition, the positions of the LED device 16 and the phototransistor 12 are defined by the pads formed in the substrate 24. This can limit one's ability to form optocoupler packages with different device configurations.

It is possible to combine an IC driver device, an LED device, phototransistor device (or diode device) with trans-impedance amplifiers into one package (a microcoupler-SIP or system in a package). One way to configure the components in a package is to place them all on a single leadframe structure, perform a wirebonding process, and then a molding process. However, this package configuration may not be the most efficient configuration as the three devices are laterally spaced from each other on the leadframe structure. For example, if this arrangement is in an SOIC type package, the package would have a size of about 4×5 mm$^2$ and a thickness of about 3.6 mm. The side lead span would be about 6 mm. This may be too large for some applications.

Embodiments of the invention address this problem and other problems, individually and collectively.

SUMMARY

Embodiments of the invention are directed to optocoupler packages, optocoupler assemblies, and methods for making the same.

One embodiment of the invention is directed to a die package comprising a premolded substrate comprising a leadframe structure, a first device attached to the leadframe structure, and a molding material covering at least part of the leadframe structure and the first device. The first device is preferably a control device such as a driver IC. A second device is attached to the premolded substrate. The second device is preferably an optoelectronic device such as a light emitting diode device (or LED device).

Another embodiment of the invention is directed to a method for forming a package. The method comprises forming a premolded substrate comprising a leadframe structure, a first device attached to the leadframe structure, and a molding material covering at least part of the leadframe structure and the first device. After the premolded substrate is formed, a second device is attached to the premolded substrate.

Another embodiment of the invention is directed to a die package comprising: a substrate comprising a leadframe structure, a first device attached to the leadframe structure; and a second device attached to the substrate, wherein the first device is in a stacked relationship with the second device, and wherein at least one of the first and the second devices is an optoelectronic device.

These and other embodiments of the invention are described in further detail below with reference to the Drawings.

BRIEF DESCRIPTION OF THE DRAWINGS

FIGS. 4-5 show top perspective views of the optocoupler package in FIG. 2, with some internal components being shown.

FIG. 6 shows a bottom perspective view of the optocoupler package shown in FIG. 2 with some internal components being shown.

FIG. 7 shows a top view of the optocoupler package shown in FIG. 2 with some internal package components being shown.

FIG. 8 shows a bottom view of the optocoupler package shown in FIG. 2 with some internal package components being shown.

FIG. 9 shows a side view of the optocoupler package shown in FIG. 2 with some internal package components being shown.

FIGS. 11(a)-11(i) show precursors as they are formed when forming an optocoupler package according to an embodiment of the invention.

FIGS. 12-13 show top perspective views of another optocoupler package embodiment of the invention with some internal components being shown.

FIG. 14 shows a bottom perspective view of the optocoupler package shown in FIG. 12.

FIG. 15 shows a close up view of a portion of the optocoupler package shown in FIG. 13.

FIGS. 17(a)-17(e) show precursors as they are formed when forming an optocoupler package according to an embodiment of the invention.

In the Figures, like numerals designate like elements and descriptions of some elements may not be repeated in some instances.

DETAILED DESCRIPTION

Figure 1:
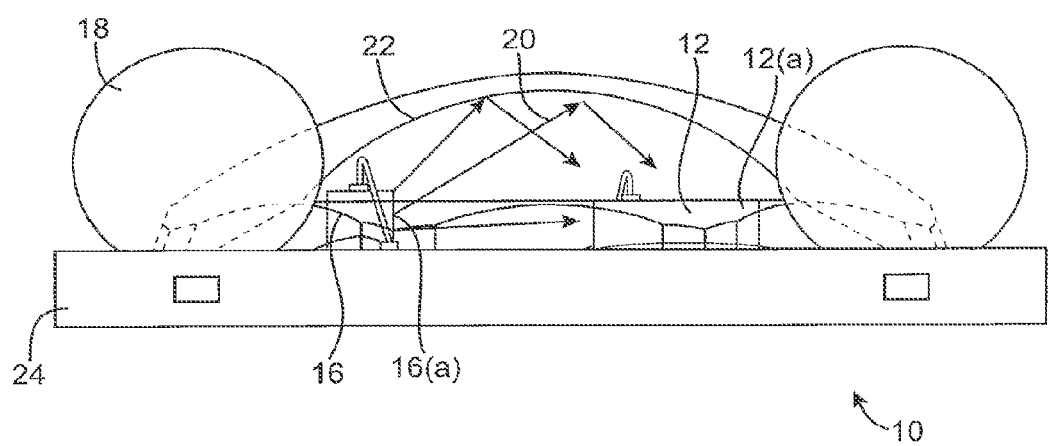
FIG. 1 shows a side view of a conventional optocoupler package.

Embodiments of the invention are directed to packages including a pre-molded device such as an IC driver, and leadframe substrate, and methods for making the same, in a preferred embodiment, the method of assembly includes stacking an LED device and phototransistor device on a pre-molded substrate comprising a control device such as an IC driver device and leadframe structure. Other embodiments of the invention are directed to attachment structures that can be used to orient an LED device so that it emits light directly onto a receiver surface of a phototransistor device. The attachment structure and the premolded substrate can be combined in embodiments of the invention. Other embodiments of the invention may be directed to gel dome generation and molding processes.

Embodiments of the invention provide a micro-coupler SIP (system in a package) solution, which can be based on the concept of a premolded substrate including a device and leadframe structure. In one embodiment, an LED device and/or a phototransistor device can be stacked on a control device in a premolded substrate. In another embodiment, an LED device may be placed on an attachment structure so that it is oriented at an angle with respect to a light receiving surface of a phototransistor device.

Embodiments of the invention have a number of advantages. First, embodiments of the invention can improve the photoelectrical transition ratio between an LED device and a phototransistor device (or diode device) by allowing an oriented LED emitting surface to partially or fully face a receiver surface of a phototransistor device (or diode device) in an optocoupler. Second, embodiments of the invention can have a standard LGA (land grid array) pin out. Third, compared to a planar SOIC-8 type package, the size of a package according to an embodiment of the invention can be reduced 56% from 4×5 mm$^2$ to 2.5×3.5 mm$^2$. The thickness of the package is also reduced about 65% from about 3.6 mm to about 1.2 mm in a first design embodiment, and about 55% from 3.6 mm to 1.60 mm for a second design embodiment.

One embodiment of the invention is directed to a die package comprising a premolded substrate comprising a leadframe structure, a first device attached to the leadframe structure, and a molding material covering at least part of the leadframe structure and the first device. The first device is preferably a control device such as a driver IC (integrated circuit). A second device is attached to the premolded substrate. The second device is preferably an optoelectronic device such as a light emitting diode device (or LED device). The devices that are used in embodiments of the invention may be in the form of semiconductor dies.

In the specific embodiments described herein, the first and second devices are preferably a control and an optoelectronic device, respectively. Exemplary optoelectronic devices include can include electrical as well as optical properties (e.g., an electrical input and an optical output, or vice-versa). However, it is understood that embodiments of the invention can apply to packages that can have purely electrical characteristics (e.g., without optical transmission). For example, either or both of the first and second devices could be purely electrical devices such as MOSFETs in other embodiments of the invention.

Figure 2:
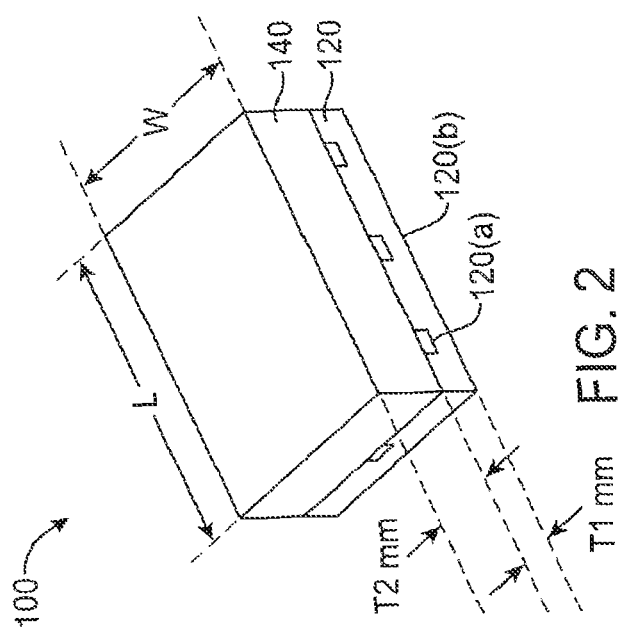
FIG. 2 shows a top perspective with of an optocoupler package according to an embodiment of the invention.

FIG. 2 shows a top perspective view of a package 100 according to an embodiment of the invention. The package 100 includes a premolded substrate 120 comprising a leadframe structure 120(a) and a first molding material 120(b). A second molding material 140 is formed on the premolded substrate 120. The first molding material 120(b) and the second molding material 140 may be the same or different. In either case, there can be a planar interface between the first molding material 120(b) and the second molding material 140, since the first molding material 120(b) and the second molding material 140 are molded at different times.

In FIG. 2, L may be about 3.5 mm, W may be about 2.5 mm, T1 may be about 0.4 mm, and T2 may be about 1.20 mm. Of course, embodiments of the invention are not limited to these sizes and the dimensions of suitable packages can be more of less than any of these dimensions.

Figure 3:
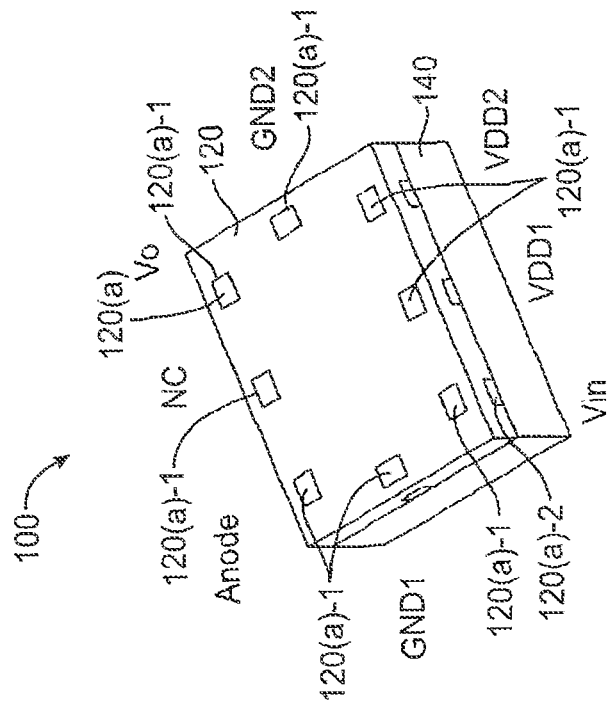
FIG. 3 shows a bottom perspective view of an optocoupler package according to an embodiment of the invention.

FIG. 3 shows a bottom perspective view of the package 100 shown in FIG. 2, FIG. 3 shows bottom pads 120(a)-1 and side tie bars 120(a)-2. The bottom pads include the following designations in the illustrated example: NC (not connected); Vo (output data); GND2 (output ground); VDD1 (input supply voltage), VDD2 (output supply voltage), Vin (input data), GND1 (input ground), and Anode). It is understood that embodiments of the invention are not limited to the specific pad labels shown in FIG. 3.

FIGS. 4 and 5 each show a top perspective view of the package 100 shown in FIG. 1, with some internal components being shown.

FIG. 4 shows a second molding material 140 formed over a premolded substrate 120. A light transmissive material 190 is present between the second molding material 140 and the premolded substrate 120. The leadframe structure 120(a) of the premolded substrate 120 includes a number of conductive pad regions 120(a)-2 for wirebonds. Various wires 184, 193(a), 193(b), 193(c) penetrate the light transmissive material and are bonded to various conductive pad regions 120(a)-2. The surfaces of the conductive pad regions 120(a)-2 that are internal to the package 100 are substantially coplanar with the surface of the molding material 120(b) that is internal to the package 100, but external to the substrate 120.

FIG. 5 shows an optical emitter device 112 mounted on a first die attach pad 120(c)-1 of the leadframe structure 120(a) and an optical receiver device 116 mounted on a second die attach pad 120(c)-2. Conductive adhesives such as solder can be used to connect the optical receiver device 116 and the optical emitter device 112 to the die attach pads 120(c)-1, 120(c)-2 of the leadframe structure 120. A wire 184 connects a top surface of the optical emitter device 112 to one of the pad regions 120(a)-2. Three bonding wires 193(a), 193(b), 193(c) also connect inputs and/or outputs at the top surface of the optical receiver device 116 to other pad regions 120(a)-2. The optical emitter device 112 and the optical receiver device 116 are covered by the light transmissive material 190 as shown in FIG. 4, so that optical signals can pass from the optical emitter device 112 to the optical receiver device 116. The light transmissive material 190 may also be referred to as a "light coupling gel" in some cases.

FIG. 6 shows the underside of the package 100 shown in FIG. 2. As shown, a control device 56 is mounted on the surface of the pad 120(c)-1 that is opposite to the surface to which the optical emitter device 112 is attached. As shown, a number of bonding wires 58, 93 connect the pad regions 120(a)-2 to the outer surface of the control device 56. In FIG. 5, the surface of the die attach pad 120(c)-2 that is opposite the surface which has the optical receiver device 116 mounted to it, does not have a device mounted on it. However, a device could be mounted to it in other embodiments of the invention.

FIG. 7 shows a top view of the optocoupler package shown in FIG. 2 with some internal package components being shown. FIG. 8 shows a bottom view of the optocoupler package shown in FIG. 2 with some internal package components being shown. FIG. 9 shows a side view of the optocoupler package shown in FIG. 2 with some internal package components being shown. The components in FIGS. 7-9 have already been described above. However, as shown in FIGS. 7-9, the package 100 has a rectangular side profile and top profile. It can also be characterized as a "leadless" package since leads do not extend past lateral surfaces of the second molding material 140. Although a leadless package is illustrated, it is understood that embodiments of the invention also include leaded packages.

Figure 10:
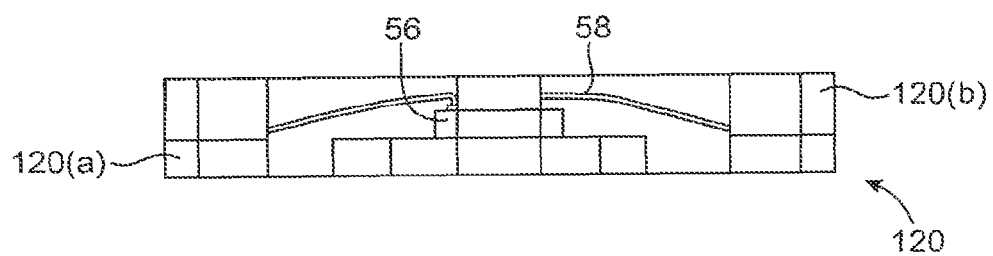
FIG. 10 shows a side view of a premolded substrate with some internal package components being shown.

FIG. 10 shows a side view of a premolded substrate 120 with some internal package components being shown. As shown, exterior surfaces of the leadframe structure 120(a) are substantially coplanar with the exterior surfaces of the first molding material 120(b).

Other embodiments of the invention may be directed to methods for making optocoupler packages like the ones described above. One embodiment of the invention is directed to a method comprising forming a premolded substrate comprising a leadframe structure, a first device (e.g., a control device such as a driver IC) attached to the leadframe structure, and a molding material covering at least part of the leadframe structure and the first device. After the premolded substrate is formed, a second device (e.g., an optical emitter device such as an LED device), and a third device (e.g., an optical receiver device such as a phototransistor device) are attached to the premolded substrate. The attachment of the devices to the substrate may be made through various structures including attachment structures and conductive adhesives.

FIGS. 11(a)-11(i) show precursors as they are formed when forming an optocoupler package according to an embodiment of the invention.

FIG. 11(a) shows a leadframe structure 120(a). The leadframe structure 120(a) can be obtained by etching, stamping, or any other suitable process. Suitable materials for leadframe structures include copper, aluminum, and alloys thereof. In some embodiments, the leadframe structures can be plated with solderable metals or other types of metals (e.g., Ni, Pd, etc.). Furthermore, the leadframe structures may be formed as continuous or discontinuous sections of metal.

As shown, the leadframe structure 120(a) can include die attach pads 120(c)-1, 120(c)-2, and bonding pad regions 120(a)-2 and pads 120(a)-1. As shown, the bonding pad regions 120(a)-2 may extend laterally in two or three directions from each pad 120(a)-1. Some regions may be partially etched (e.g., half etched) to help lock a molding material to the second leadframe structures 120(a).

In FIG. 11(b), a control device 56 (e.g., a driver IC) is mounted on a first die attach pad 120(c)-1 of the leadframe structure 120. As shown, a second die attach pad 120(c)-2 in the leadframe structure 120 is separated from the first die attach pad 120(c)-1. The control device 56 may be mounted on the first die attach pad 120(c)-1 using any suitable conductive adhesive including solder.

FIG. 11(c) shows a plurality of bonding wires 58 connecting an outward surface of the control device 56 to bonding pad regions 120(a)-2. Any suitable conventional wirebonding process can be used. Also, suitable bonding wires may include copper, gold, or composites including noble metal coated copper wires.

FIG. 11(d) shows a premolded substrate 120 after molding. A first molding material 120(b) is molded around the leadframe structure 120(a). As shown, the pad surfaces 120(a)-1 are exposed by the first molding material 120(b), and are substantially coplanar with the exterior surface of the molding material 120(b). U.S. Pat. No. 7,061,077, which is herein incorporated by reference in its entirety, discloses other suitable premolding processes.

FIG. 11(e) shows the premolded substrate 120 flipped over. Surfaces of the die attach pads 120(c)-1, 120(c)-2, as well as surfaces of the bonding pad regions 120(a)-2 are exposed by the first molding material 120 and are substantially coplanar with the exterior surface of the first molding material 120.

After flipping the substrate 120 over, as shown in FIG. 11(f), the optical emitter device 112 and the optical receiver device 116 can be attached to the die attach pads 120(c)-1, 120(c)-2 of the premolded substrate 120. Any suitable conductive adhesive including solder may be used to attach the optical emitter device 112 and the optical receiver device 116 to the die attach pads 120(c)-1, 120(c)-2 of the premolded substrate 120.

After bonding the optical emitter device 112 and the optical receiver device 116 to the die attach pads 120(c)-1, 120(c)-2 of the premolded substrate 120, as shown in FIG. 11(g), wires 184, 193(a), 193(b), 193(c) can be used to wirebond the optical emitter device 112 and the optical receiver device 116 to the bonding pad regions 120(a)-2.

After wirebonding, as shown in FIG. 11(h), a light transmissive material 190 may be deposited on the substrate 120 and over the optical emitter device 112 and the optical receiver device 116. The light transmissive material 190 can then be cured, or partially solidified. If desired, a light reflective coating may be deposited on the light transmissive material 190 to keep light transmitted from the optical emitter device 112 to the optical receiver device 116 within the light transmissive material 190.

After depositing the light transmissive material 190 on the substrate 120, a second molding material 140 may be formed on the substrate 120 to form the package 100. Any suitable molding process can be used including conventional molding processes using molding tools with molding dies. After molding, a singulation process can be performed to separate the formed package from other packages in an array of packages.

FIGS. 12-13 show top perspective views of another optocoupler package embodiment of the invention with some internal components being shown. FIG. 14 shows a bottom perspective view of the optocoupler package shown in FIG. 11. FIG. 15 shows a close up view of a portion of the optocoupler package shown in FIG. 11. Many of the components in FIGS. 12-15 are described above and the descriptions need not be repeated.

FIG. 13 specifically shows an attachment structure 192 including a side mounting pad for vertically mounting an optical emitter device 112. FIG. 15 shows the attachment structure 192 attached to the substrate 120 with a vertically oriented optical emitter device 112 attached to a pad of the attachment structure 192.

Figure 16:
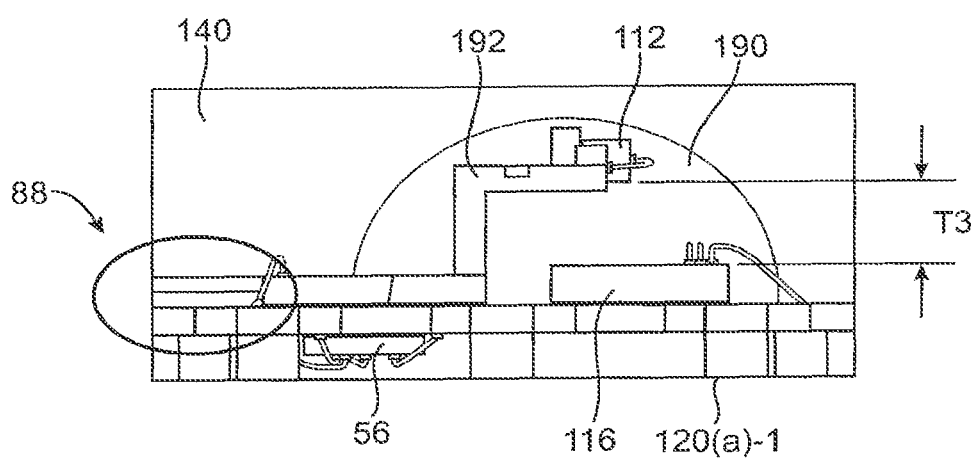
FIG. 16 shows a side view of the optocoupler package shown in FIG. 13.

FIG. 16 shows a side view of the optocoupler package shown in FIG. 11. Reference numeral 88 shows a partially etched (e.g., half-etched) region of the attachment structure 192. The partially etched region makes it easier for the second molding material 140 to lock to the attachment structure 190. Also, the distance T3 may be about 0.45 mm. Since the emitting surface of the optical emitting device 112 at least partially faces the receiving surface of the optical receiver device 116, the transmission of light from the optical emitting device 112 to the optical receiver device is more efficient than in the conventional package illustrated in FIG. 1.

The mounting of the attachment structure 192 to the substrate 120, and the subsequent formation of a die package 100 is shown in FIGS. 17(a)-17(e). As shown in FIG. 17(a), an attachment structure 192 is first obtained by etching, stamping, or any other suitable process. It can be made of copper or any other suitable conductive material. The attachment structure 192 can include a first section 192(*a*) and a second section 192(*b*). The first section 192(*a*) can include a first substrate bonding portion 192(*a*)-1, second and third perpendicular intermediate portions 192(*a*)-2, 192(*a*)-3, and a fourth wire bonding portion 192(*a*)-4. The second section 192(*b*) can include a first substrate bonding portion 192(*b*)-1, second and third perpendicular intermediate portions 192(*b*)-2, 192(*b*)-3, and a fourth device bonding portion 192(*b*)-4. Lateral tie bars 178 also extend laterally outward from the first and second sections 178. The tie bars 178 may join the sections to an outer frame with other attachment structures.

After the attachment structure 192 is obtained, an optical emitter device 112 can be mounted on the fourth device bonding portion 192(*b*)-4. After the optical emitter device 112 is mounted on the fourth device bonding portion 192(*b*)-4, a wire can be bonded to the fourth bonding portion 192(*a*)-4, as shown in FIG. 17(*b*).

As shown in FIG. 17(*c*), the precursor shown in FIG. 17(*b*) is then attached to the premolded substrate 120. Any suitable adhesive including solder can be used to attach the attachment structure 192 to the substrate 120. The formation of a premolded substrate 120, and the subsequent mounting of an optical receiver device 116 are described above with reference to FIGS. 11(*a*)-11(*f*). A wire can be bonded to 120(*a*)-2 from 192(*a*)-1.

As illustrated in FIG. 17(*c*), the fourth device bonding portion 192(*b*)-4 can orient the optical emitter device 112 so that it (and consequently its light emitting surface) can be oriented at an angle (e.g., substantially perpendicularly) to the light receiving surface of the optical receiver device 116 that is mounted on the premolded substrate 120.

FIG. 17(*d*) shows the deposition of an optically transmissive material 190. The light transmissive material 190 can then be cured, or partially solidified. If desired, a light reflective coating may be deposited on the light transmissive, material 190 to keep light transmitted from the optical emitter device 112 to the optical receiver device 116 within the light transmissive material 190.

After depositing the light transmissive material 190 on the substrate 120, a second molding material 140 may be formed on the substrate 120 to form the package 100. Any suitable molding process can be used including conventional molding processes using molding tools with molding dies.

The above-described optocoupler packages can be used in electrical assemblies including circuit substrates, as well as systems which may be embodied by cell phones and computers.

While the foregoing is directed to certain preferred embodiments of the present invention, other and further embodiments of the invention may be devised without departing from the basic scope of the invention. Such alternative embodiments are intended to be included within the scope of the present invention. Moreover, the features of one or more embodiments of the invention may be combined with one or more features of other embodiments of the invention without departing from the scope of the invention.

What is claimed is:

1. A die package comprising:
   a premolded substrate comprising
      a leadframe structure having at least two die attach pads disposed in a common plane,
      a first device attached to one of the at least two die attach pads of the leadframe structure, and
      a first molding material covering at least part of the leadframe structure and the first device;
   a second device attached to the other of the at least two die attach pads of the premolded substrate, and
   a second molding material covering the second device,
   wherein a portion of the second molding material and a portion of the first molding material abut one another at a discernible planar interface that is disposed between the first and second molding materials.

2. The die package of claim 1 wherein the second device comprises an optoelectronic device.

3. The die package of claim 1 wherein the first device comprises a control device.

4. The die package of claim 1 further comprising a third device, wherein the third device is mounted on the premolded substrate.

5. The die package of claim 1 further comprising a third device, wherein the third device is mounted on the premolded substrate, wherein the second device and the third device comprise optoelectronic devices and wherein the first device comprises a control device.

6. The die package of claim 1 wherein the leadframe structure comprises a die attach pad, wherein the first device is mounted on a first surface of the die attach pad and wherein a third device is mounted on a second surface of the die attach pad.

7. The die package of claim 1 wherein the die package is an optocoupler package.

8. The die package of claim 1 further comprising a third device, wherein the third device is mounted on the premolded substrate, wherein the second device and the third device comprise optoelectronic devices and wherein the first device comprises a control device, and wherein the second molding material further covers the third device.

9. The die package of claim 1 further comprising an elongated attachment structure, wherein the attachment structure includes a vertical structure at one end, and wherein a third device is attached to the vertical structure at the one end and the other end of the attachment structure is electrically and mechanically attached to the one of said two die pads.

10. The die package of claim 9 wherein the first device is a control device.

11. A method comprising:
    forming a premolded substrate comprising a leadframe structure having at least two die attach pads disposed in a common plane, a first device attached to one of the at least two die attach pads of the leadframe structure, and a first molding material covering at least part of the leadframe structure and the first device;
    attaching a second device to the other of the at least two die attach pads of the premolded substrate; and
    forming a second molding material that covers the second device such that a portion of the second molding material and a portion of the first molding material abut one another at a discernible planar interface that is disposed between the first and second molding materials.

12. The method of claim 11 wherein the second device comprises an optoelectronic device.

13. The method of claim 11 wherein the first device comprises a control device.

14. The method of claim 11 further comprising attaching a third device to the premolded substrate.

15. The method of claim 11 further comprising attaching a third device to the premolded substrate, and wherein the second device and the third device comprise optoelectronic devices and wherein the first device comprises a control device.

16. The method of claim 11 wherein the leadframe structure comprises a die attach pad, wherein the first die is mounted on a first surface of the die attach pad, and wherein a third die is mounted on a second surface of the die attach pad.

17. The method of claim 11 wherein a die package is formed after attaching the second device to the premolded substrate, and wherein the die package is an optocoupler package.

18. The method of claim 11 further comprising attaching a third device to one end of an elongated attachment structure, and then attaching the other end of the attachment structure to said one of the two die attach pads.

19. The method of claim 11 wherein the first device comprises a control device and the second device comprises an optoelectronic device.

* * * * *

UNITED STATES PATENT AND TRADEMARK OFFICE
CERTIFICATE OF CORRECTION

PATENT NO. : 8,525,192 B2
APPLICATION NO. : 13/246682
DATED : September 3, 2013
INVENTOR(S) : Y. Liu et al.

It is certified that error appears in the above-identified patent and that said Letters Patent is hereby corrected as shown below:

On The Title Page,

Item (75)  Inventors  "Zhongfa Yuan, Jiangsu (CN)" should read
Pg. 1, Col. 1          --Zhongfa Yuan, Suzhou (CN)--

Signed and Sealed this
Twelfth Day of July, 2016

Michelle K. Lee
*Director of the United States Patent and Trademark Office*